United States Patent
Kobayashi et al.

(10) Patent No.: US 7,667,535 B2
(45) Date of Patent: Feb. 23, 2010

(54) AMPLIFIER CIRCUIT WITH INPUT TERMINALS THEREOF CONNECTED TO SAMPLING CAPACITORS

(75) Inventors: Shigeto Kobayashi, Gifu (JP); Atsushi Wada, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 34 days.

(21) Appl. No.: 12/073,610

(22) Filed: Mar. 7, 2008

(65) Prior Publication Data

US 2008/0218266 A1    Sep. 11, 2008

(30) Foreign Application Priority Data

Mar. 8, 2007   (JP)  ............................. 2007-058296

(51) Int. Cl.
*H03F 1/02* (2006.01)

(52) U.S. Cl. .......................................................... 330/9

(58) Field of Classification Search .................... 330/9; 327/124, 307

See application file for complete search history.

(56) References Cited

U.S. PATENT DOCUMENTS 4,760,346 A * 7/1988 Kultgen et al. ................. 330/69
6,573,785 B1 * 6/2003 Callicotte et al. ............... 330/9

FOREIGN PATENT DOCUMENTS

JP     2005-354172      12/2005

* cited by examiner

*Primary Examiner*—Robert Pascal
*Assistant Examiner*—Khiem D Nguyen
(74) *Attorney, Agent, or Firm*—McDermott Will & Emery LLP

(57) ABSTRACT

Sampling capacitors are connected respectively to a pair of differential input terminals of an operational amplifier. The sampling capacitors sample input signals. Source terminals and drain terminals of dummy switches are connected respectively to paths connecting the operational amplifier and the sampling capacitors, so that a common-mode voltage of differential input voltages to the operational amplifier is adjusted by gate-channel capacitances.

3 Claims, 10 Drawing Sheets

FIG.2

| | SMP | AMP | SMP | AMP | SMP | AMP | SMP |
|---|---|---|---|---|---|---|---|
| OP | AZ | AMP | AZ | AMP | AZ | AMP | AZ |
| SW1 | ON | OFF | ON | OFF | ON | OFF | ON |
| SW2 | OFF | ON | OFF | ON | OFF | ON | OFF |
| SW3 | ON | OFF | ON | OFF | ON | OFF | ON |
| SW4 | OFF | ON | OFF | ON | OFF | ON | OFF |
| SW5 | OFF | ON | OFF | ON | OFF | ON | OFF |
| SW6 | ON | OFF | ON | OFF | ON | OFF | ON |
| SW7 | OFF | ON | OFF | ON | OFF | ON | OFF |
| SW8 | ON | OFF | ON | OFF | ON | OFF | ON |

FIG.6

|  | SMP | AMP | SMP | AMP | SMP | AMP | SMP |
|---|---|---|---|---|---|---|---|
| OP | AZ | AMP | AZ | AMP | AZ | AMP | AZ |
| SW1 | ON | OFF | ON | OFF | ON | OFF | ON |
| SW2 | OFF | ON | OFF | ON | OFF | ON | OFF |
| SW3 | ON | OFF | ON | OFF | ON | OFF | ON |
| SW4 | OFF | ON | OFF | ON | OFF | ON | OFF |
| CLK | Low | High | Low | High | Low | High | Low |
| CLKb | High | Low | High | Low | High | Low | High |
| 10 | OFF | ON | OFF | ON | OFF | ON | OFF |
| 12 | OFF | ON | OFF | ON | OFF | ON | OFF |

FIG.10

|  | SMP | AMP | SMP | AMP | SMP | AMP | SMP |
|---|---|---|---|---|---|---|---|
| OP | AZ | AMP | AZ | AMP | AZ | AMP | AZ |
| SW1 | ON | OFF | ON | OFF | ON | OFF | ON |
| SW2 | OFF | ON OFF | ON OFF | ON OFF | | | |
| SW3 | ON | OFF | ON | OFF | ON | OFF | ON |
| SW4 | OFF | ON OFF | ON OFF | ON OFF | | | |
| SW5 | OFF | ON | OFF | ON | OFF | ON | OFF |
| SW6 | ON | OFF | ON | OFF | ON | OFF | ON |
| SW7 | OFF | ON | OFF | ON | OFF | ON | OFF |
| SW8 | ON | OFF | ON | OFF | ON | OFF | ON |

US 7,667,535 B2

AMPLIFIER CIRCUIT WITH INPUT TERMINALS THEREOF CONNECTED TO SAMPLING CAPACITORS

CROSS-REFERENCE TO RELATED APPLICATIONS

This application is based upon and claims the benefit of priority from the prior Japanese Patent Application No. 2007-058296, filed on Mar. 8, 2007, the entire contents of which are incorporated herein by reference.

BACKGROUND OF THE INVENTION

1. Field of the Invention

The present invention relates to an amplifier circuit used for an input stage of a comparator and the like.

2. Description of the Related Art

A fully differential operational amplifier having two input terminals and two output terminals is used for an input stage of a comparator and other various circuits. Compared with a single-ended operational amplifier, the fully differential operational amplifier is more tolerant of noise such as clock feedthrough. In order to make an average value of two-line output voltages constant, a common-mode feedback (CMFB) circuit is often added to the fully differential operational amplifier.

However, if the CMFB circuit is used, delay due to a feedback loop must be taken into consideration. For this reason, when the operational amplifier is used particularly in an open loop, the delay is one of factors that hinders the faster operation.

SUMMARY OF THE INVENTION

An amplifier circuit according to one embodiment of the present invention comprises: an operational amplifier including a pair of differential input terminals; sampling capacitors, connected to the differential input terminals, which sample input signals; and a regulating capacitor, connected in parallel with one end of each of the sampling capacitors, which adjusts a common-mode voltage of differential input voltages to the operational amplifier.

BRIEF DESCRIPTION OF THE DRAWINGS

Embodiments will now be described by way of examples only, with reference to the accompanying drawings which are meant to be exemplary, not limiting, and wherein like elements are numbered alike in several Figures in which:

FIG. 2 is a timing chart to explain an operation of an amplifier circuit according to a first embodiment of the present invention;

FIG. 6 is a timing chart to explain an operation of an amplifier circuit according to a fourth embodiment of the present invention;

FIG. 10 is a timing chart to explain an operation of an amplifier circuit according to a seventh embodiment of the present invention.

DETAILED DESCRIPTION OF THE INVENTION

Figure 1:
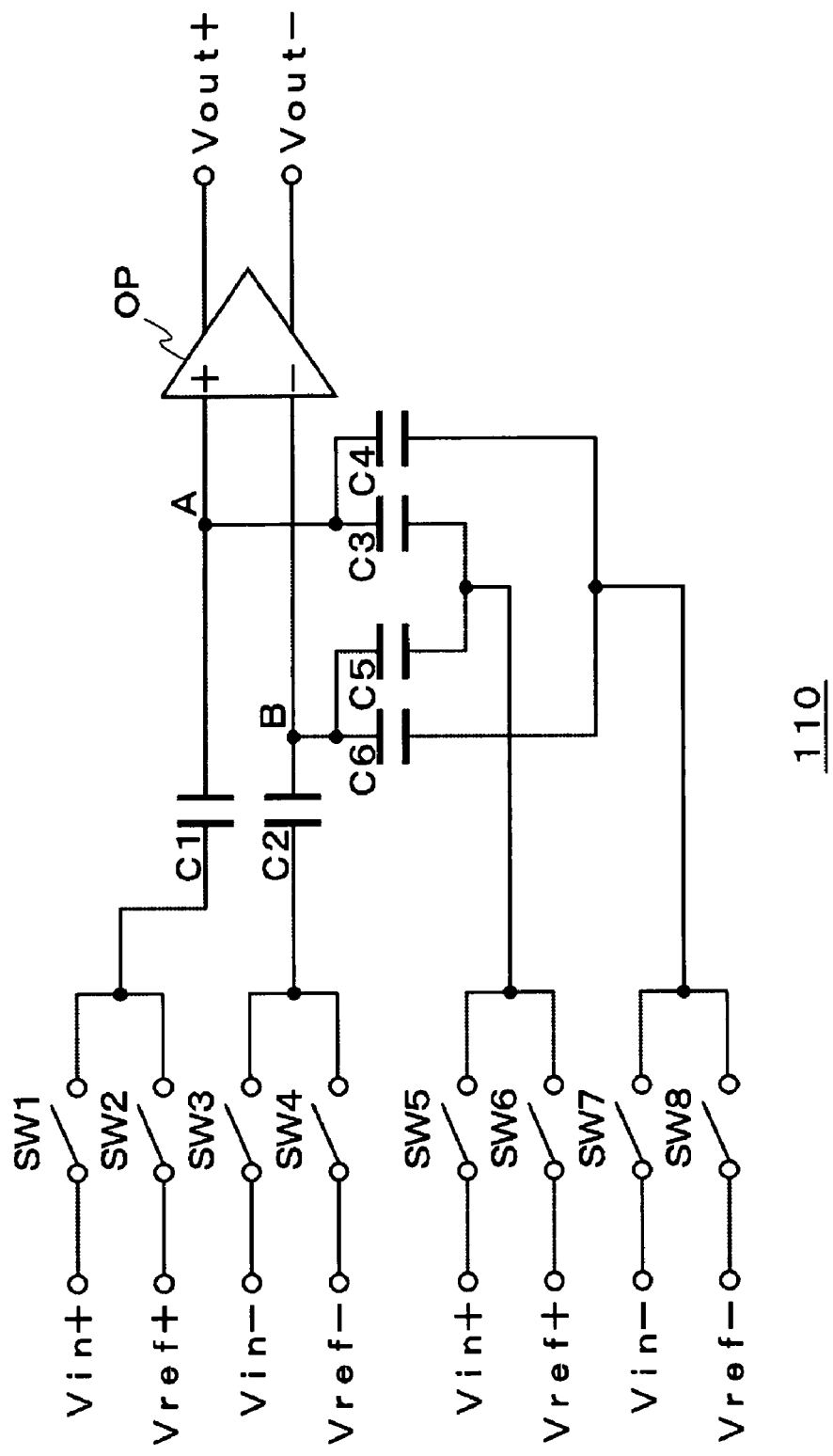
FIG. 1 is a circuit diagram showing a structure of an amplifier circuit according to a first embodiment of the present invention.

The invention will now be described by reference to the preferred embodiments. This does not intend to limit the scope of the present invention, but to exemplify the invention.

A description of a typical embodiment will be given before describing a detailed description of embodiments of the present invention. An amplifier circuit according to one embodiment of the present invention comprises: an operational amplifier including a pair of differential input terminals; sampling capacitors, connected to the differential input terminals, which sample input signals; and a regulating capacitor, connected in parallel with one end of each of the sampling capacitors, which adjusts a common-mode voltage of differential input voltages to the operational amplifier.

According to this embodiment, an output common-mode voltage can be stabilized by adjusting a common-mode voltage of input signals. Also, since no common-mode feedback system is used, the delay by the system does not occur and therefore a fast operation is possible.

The regulating capacitor may include a gate-channel capacitance of a MOS switch where a source terminal and a drain terminal thereof are connected to a path connecting the operational amplifier and the sampling capacitor.

The MOS switch may be turned on during an amplifying period of the amplifier circuit so as to generate the gate-channel capacitance, and the MOS switch may be turned off during a sampling period thereof so as to eliminate the gate-channel capacitance. According to this embodiment, the occurrence and disappearance of the gate-channel capacitance suppresses the variation in the common-mode voltage of the differential input voltages to the operational amplifier.

The amplifier circuit may further comprise a short-circuiting switch which short-circuits an output terminal and an input terminal of the operational amplifier. The MOS switch may offset a charge released to the path by turning off the short-circuiting switch and using the gate-channel capacitance, and the MOS switch may adjust potential of the path. The electric charge to be offset by using the gate-channel capacitance may be a part or the entire of the electric charge released from the short-circuiting switch. According to this embodiment, the MOS switch provided for the purpose of reducing the noise of the short-circuiting switch can be used also to suppress the variation in the common-mode voltage.

One end of the regulating capacitor is connected to a path connecting the operational amplifier and the sampling capacitor, and a voltage which differs between during an amplifying period and during a sampling period of the amplifying circuit is inputted to the other end of the regulating capacitor. As a result, the potential of the above-mentioned path can be stabilized.

A reference voltage may be inputted to the sampling capacitor during the amplifying period. The input signal may be inputted to the other end of the regulating capacitor during the amplifying period, and the reference voltage may be inputted thereto during the sampling period. According to this embodiment, a voltage of a given phase is inputted to the sampling capacitor, whereas a voltage of the reversed phase is inputted to the regulating capacitor. Thus, the variation in the common-mode voltage can be suppressed.

Arbitrary combinations of the aforementioned constituting elements, and the implementation of the present invention in the form of a method, an apparatus, a system and so forth may also be effective as and encompassed by the embodiments of the present invention.

With reference to the Figures, the invention will now be described based on the following preferred embodiments. The same or equivalent components, members and processings shown in Figures are given the identical reference numerals and the repeated description thereof will be omitted as appropriate. The following preferred embodiments do not intend to limit the scope of the present invention but exemplify the invention, and all of the features and the combinations thereof described in the embodiments are not necessarily essential to the invention.

FIG. 1 is a circuit diagram showing a structure of an amplifier circuit 110 according to a first embodiment of the present invention. The amplifier circuit 110 includes a fully differential operational amplifier OP. A noninverting input terminal of the operational amplifier OP is connected to one end of a first sampling capacitor C1. The other end of the first sampling capacitor C1 is connected to one end of a first switch SW1 and a second switch SW2, which are connected in parallel with each other. A positive input signal Vin+ of differential input signals is applied to the other end of the first switch SW1, whereas a positive reference voltage Vref+ is applied to the other end of the second switch SW2.

An inverting input terminal of the operational amplifier OP is connected to one end of a second sampling capacitor C2. The other end of the second sampling capacitor C2 is connected to one end of a third switch SW3 and a fourth switch SW4, which are connected in parallel with each other. A negative input signal Vin− is applied to the other end of the third switch SW1, whereas a negative reference voltage Vref− is applied to the other end of the fourth switch SW4.

One end of a first regulating capacitor C3 and a second regulating capacitor C4, which are connected in parallel with each other, is connected to a first node A between the noninverting input terminal of the operational amplifier OP and the one end of the first sampling capacitor C1. The other end of the first regulating capacitor C3 is connected to one end of a fifth switch SW5 and a sixth switch SW6, which are connected in parallel with each other. A positive input signal Vin+ is applied to the other end of the fifth switch SW5, whereas a positive reference voltage Vref+ is applied to the other end of the sixth switch SW6. The other end of the second regulating capacitor C4 is connected to one end of a seventh switch SW7 and an eighth switch SW8, which are connected in parallel with each other. A negative input signal Vin− is applied to the other end of the seventh switch SW7, whereas a negative reference voltage Vref− is applied to the other end of the eighth switch SW8.

One end of a third regulating capacitor C5 and a fourth regulating capacitor C6, which are connected in parallel with each other, is connected to a second node B between the inverting input terminal of the operational, amplifier OP and the one end of the second sampling capacitor C2. The other end of the third regulating capacitor C5 is connected to the one end of the fifth switch SW5 and the sixth switch SW6, which are connected in parallel with each other. The positive input signal Vin+ is applied to the other end of the fifth switch SW5, whereas the positive reference voltage Vref+ is applied to the other end of the sixth switch SW6. The other end of the fourth regulating capacitor C6 is connected to the one end of the seventh switch SW7 and the eighth switch SW8, which are connected in parallel with each other. The negative input signal Vin− is applied to the other end of the seventh switch SW7, whereas the negative reference voltage Vref− is applied to the other end of the eighth switch SW8.

The operational amplifier has an auto-zero state and an amplifying state. In this patent specification, the auto-zero state indicates that the voltage of an input terminal is practically equal to the voltage of an output terminal and the operational amplifier OP is in a unity-gain buffer state.

N channel MOSFETs (Metal Oxide Semiconductor Field Effect Transistors) are used for the first switch SW1 to the eighth switch SW8. Assume herein that the capacitance value of the first sampling capacitor C1 is practically equal to that of the second sampling capacitor C2. Assume also that the capacitance value of the first regulating capacitor C3 is practically equal to that of the second regulating capacitor C4. Assume also that the capacitance value of the third regulating capacitor C5 is practically equal to that of the fourth regulating capacitor C6.

The first sampling capacitor C1, the first regulating capacitor C3 and the second regulating capacitor C4 are connected in parallel therewith at the first node A. A capacitance value $CAv$ connected to the first node A is expressed by the following Equation (1).

$$CAv = Cv + 2*D*Cv \tag{1}$$

Here, $Cv$ indicates the capacitance value of a sampling capacitor. $(D*Cv)$ indicates the capacitance value of a regulating capacitor. $D$ is a first variant. In Equation (1), the parasitic capacitance is ignored and the following description is given on the assumption that the following equations take ideal values.

The second sampling capacitor C2, the third regulating capacitor C5 and the fourth regulating capacitor C6 are connected in parallel therewith at the second node B. The capacitance value of capacitors connected to the first node A is practically the same as that of corresponding capacitors connected to node B, so that a capacitance value $CBv$ connected to the second node B is practically equal to the capacitance value $CAv$ connected to the first node A (See Equation (2)).

$$CBv = CAv \tag{2}$$

An operation of the amplifier circuit 110 according to the first embodiment is described below.

FIG. 2 is a timing chart to explain an operation of the amplifier circuit 110 according to the first embodiment. The top row in FIG. 2 indicates a state of the amplifier circuit 110 where a sampling SMP period and an amplifying AMP period repeat alternately.

During a sampling SMP period, the operational amplifier OP is in an auto-zero AZ state. Control is performed so that the first switch SW1 and the third switch SW3 are turned on and the second switch SW2 and the fourth switch SW4 are turned off. Also, control is performed so that the fifth switch SW5 and the seventh switch SW7 are turned off and the sixth switch SW6 and the eighth switch SW8 are turned on.

During a sampling SMP period, the first sampling capacitor C1 samples a positive input signal Vin+ and stores the electric charge equivalent to $\{(Vin+)-Vaz\}*C1$. The second sampling capacitor C2 samples a negative input signal Vin− and stores the electric charge equivalent to {(Vin−)−Vaz}*C2v. The first regulating capacitor C3 receives a positive reference voltage Vref+ and stores the electric charge equivalent to {(Vref+)−Vaz}*C3v. The second regulating capacitor C4 receives a negative reference voltage Vref− and stores the electric charge equivalent to {(Vref−)−Vaz}*C4v. The third regulating capacitor C5 receives a positive reference voltage Vref+ and stores the electric charge equivalent to {(Vref+)−Vaz}*C5v. The fourth regulating capacitor C6 receives a negative reference Vref− and stores the electric charge equivalent to {(Vref−)−Vaz}*C6v.

During a sampling SMP period, the electric charge stored at the first node A is expressed by the following Equation (3).

$${(Vin+)-Vaz}C1v+{(Vref+)-Vaz}*D*C3v+ \\ {(Vref-)-Vaz}*D*C4v \quad (3)$$

Similarly, during a sampling SMP period, the electric charge stored at the second node B is expressed by the following Equation (4).

$${(Vin-)-Vaz}C2v+{(Vref+)-Vaz}*D*C5v+ \\ {(Vref-)-Vaz}*D*C6v \quad (4)$$

During an amplifying AMP period, the operational amplifier OP is in an amplifying AMP state. Control is performed so that the first switch SW1 and the third switch SW3 are turned off and the second switch SW2 and the fourth switch SW4 are turned on. Also, control is performed so that the fifth switch SW5 and the seventh switch SW7 are turned on and the sixth switch SW6 and the eighth switch SW8 are turned off.

During an amplifying AMP period, the electric charge charged at the first node A is expressed by the following Equation (5).

$${(Vref+)-VAamp1}C1v+{(Vin+)- \\ VAamp1}*D*C3v+{(Vin-)-VAamp1}*D*C4v \quad (5)$$

where VAamp1 denotes the voltage of the first node A during the amplifying AMP period.

Similarly, during an amplifying AMP period, the electric charge charged at the second node B is expressed by the following Equation (6).

$${(Vref-)-VBamp1}C2v+{(Vin+)- \\ VBamp1}*D*C5v+{(Vin-)-VBamp1}*D*C6v \quad (6)$$

where VBamp1 denotes the voltage of the second node B during the amplifying AMP period.

A more specific description is now given hereinbelow. In an amplifying AMP period, the first sampling capacitor C1 receives a positive reference voltage Vref+, whereas the second sampling capacitor C2 receives a negative reference voltage Vref−. The first sampling capacitor C1 charges the electric charge, expressed by {(Vref+)−VAamp1}*C1v, at the first node A. Similarly, the second sampling capacitor C2 charges the electric charge, expressed by {(Vref−)−VBamp1}*C2v, at the second node B.

During an amplifying AMP period, the first regulating capacitor C3 samples a positive input signal Vin+, the second regulating capacitor C4 samples a negative input signal Vin−, the third regulating capacitor C5 samples a positive input signal Vin+, and the fourth regulating capacitor C6 samples a negative input signal Vin−. The first regulating capacitor C3 charges the electric charge, expressed by {(Vin+)−VAamp1}*D*C3v, at the first node A. The second regulating capacitor C4 charges the electric charge, expressed by {(Vin−)−VAamp1}*D*C4v, at the first node A. The third regulating capacitor C5 charges the electric charge, expressed by {(Vin+)−VBamp1}*D*C5v, at the second node B. The fourth regulating capacitor C6 charges the electric charge, expressed by {(Vin−)−VBamp1}*D*C6v, at the second node B.

The voltage VAamp1 at the first node A in an amplifying AMP period is expressed by the following Equation (7) because Equation (3) is equal to Equation (5) due to the law of conservation of electric charge.

Hereinbelow, for simplicity of notation, CAv and CBv in the above Equation (1) and Equation (2) are denoted by Cab, and Cv in the same equations are denoted by C.

$$VAamp1=Vaz+{(Vref+)-(Vin+)}*C/Cab+{(Vin+)- \\ (Vref+)}*D*C/Cab+{(Vin-)-(Vref-)}*D*C/Cab \quad (7)$$

Similarly, the voltage VBamp1 at the second node B in an amplifying AMP period is expressed by the following Equation (8) because Equation (4) is equal to Equation (6) due to the law of conservation of electric charge.

$$VBamp1=Vaz+{(Vref-)-(Vin-)}*C/Cab+{(Vin+)- \\ (Vref+)}*D*C/Cab+{(Vin-)-(Vref-)}*D*C/Cab \quad (8)$$

Using the above Equation (7) and Equation (8), a voltage Vsum1 which is the summation of the voltage VAamp1 of the first node A in an amplifying AMP state of the operational amplifier OP and the voltage VBamp1 of the second node B in an amplifying AMP state of the operational amplifier OP according to the first embodiment is expressed by the following Equation (9).

$$Vsum1=2Vaz+(1-2D)*C/Cab*{(Vref+)+ \\ (Vref-)-(Vin+)-(Vin-)} \quad (9)$$

A voltage obtained after the averaging of the summation result which is represented by the voltage Vsum1 shown in Equation (9) is an input common-mode voltage Vcm1 in an amplifying AMP state of the operational amplifier OP according to the first embodiment. Assume that an ideal value of the input common-mode voltage Vcm1 in an auto-zero AZ state is the auto-zero voltage Vaz in the above Equations (7) to (9), then the input common-mode voltage Vcm1 in an amplifying AMP state can be set to the auto-zero voltage Vaz by setting the first variant D in the above Equation (9) to ½. That is, setting the first variant D to ½ can make the input common-mode voltages Vcm1 in the auto-zero AZ state and the amplifying AMP state practically equal to each other. As indicated by the above Equation (1), the first variant D indicates the ratio of the capacitance value of the regulating capacitor to that of the sampling capacitor. If the value of the input common-mode voltage Vcm1 is to be set to other than the above-mentioned auto-zero voltage Vaz, the first variant D will preferably be set to other than ½.

According to the first embodiment described as above, the variation in the input common-mode voltage can be suppressed. More specifically, if the common-mode voltage of the positive input signal Vin+ and the negative input signal Vin− differs significantly from that of the positive reference voltage Vref+ and the negative reference voltage Vref−, there is a possibility that the output common-mode voltage becomes excessively large or small. Under such circumstances, there are cases where the operation range of a transistor in an operational amplifier lies outside a saturation range. In such a case, sufficient characteristics will not be obtained.

In contrast thereto, according to the first embodiment, the regulating capacitors are provided separately from the sampling capacitors and different voltages are inputted to the first node A and the second node B between in the sampling period and the amplifying period. As a result, the variation in the common-mode voltage of the differential voltages actually inputted to the sampling capacitors can be suppressed. This common-mode voltage is constrained to lie within a range within which the transistor in the operational amplifier is guaranteed to operate in the saturation range. Hence, the characteristics of the operational amplifier can be retained satisfactorily.

As a result, the output common-mode voltage can be stabilized without the use of a common-mode feedback loop. Since the common-mode feedback loop is not used, the delay caused thereby no longer needs to be taken into account and therefore fast operation becomes possible.

Figure 3:
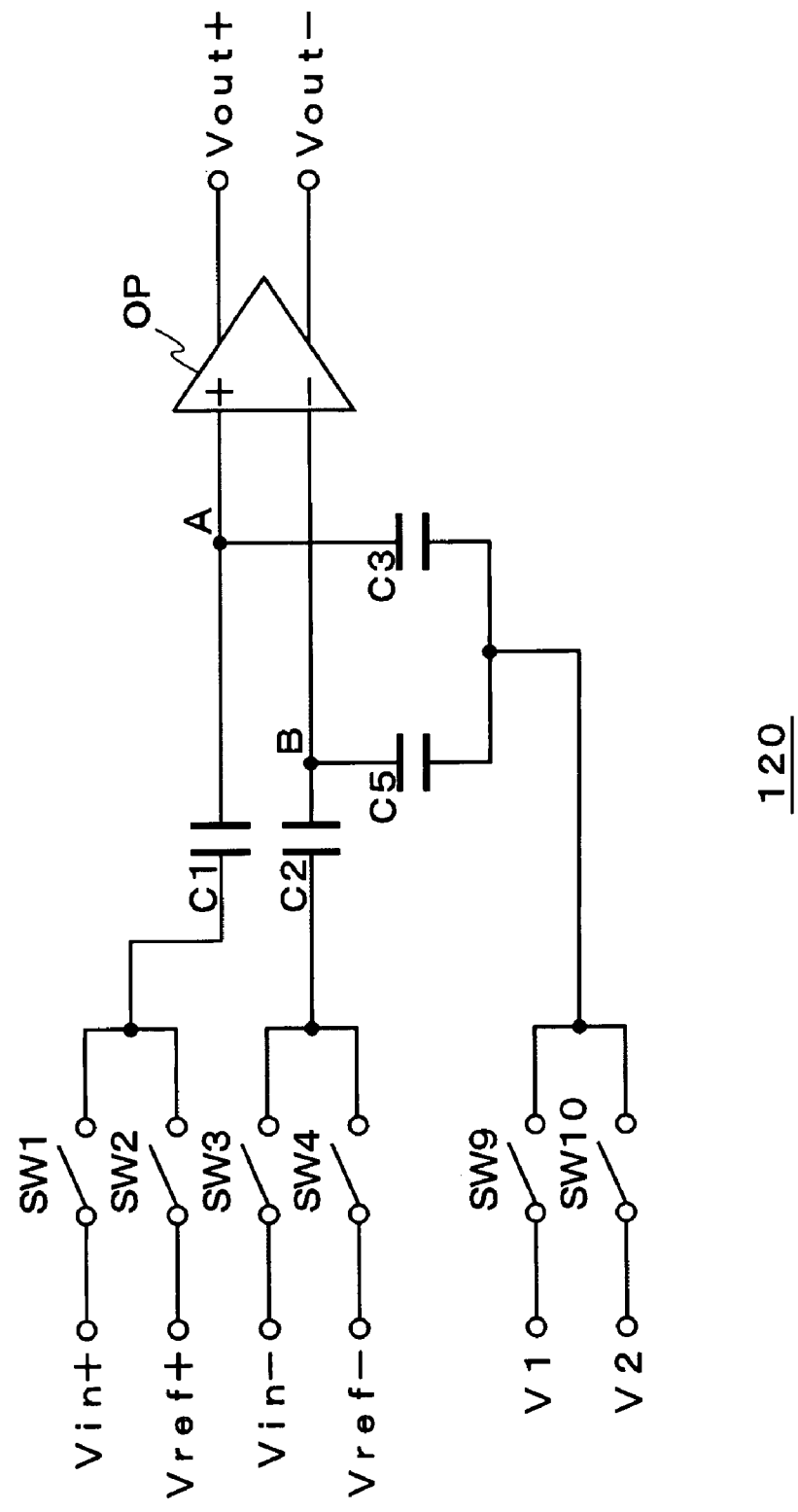
FIG. 3 is a circuit diagram showing a structure of an amplifier circuit according to a second embodiment of the present invention.

FIG. 3 is a circuit diagram showing a structure of an amplifier circuit 120 according to a second embodiment of the present invention. The basic structure of the amplifier circuit 120 according to the second embodiment is the same as that of the amplifier circuit 110 according to the first embodiment. Differences from the first embodiment will be described hereinbelow.

Compared with the amplifier circuit 110 according to the first embodiment, the structure of the amplifier circuit 120 according to the second embodiment is such that the second regulating capacitor C4, the fourth regulating capacitor C6, the fifth switch SW5, the sixth switch SW6, the seventh switch SW7 and the eighth switch SW8 are omitted and a ninth switch SW9 and a tenth switch SW10 are added. One end of the first regulating capacitor C3 is connected to the first node A, whereas the other end thereof is connected to one end of the ninth switch SW9 and the tenth switch SW10, which are connected in parallel with each other. A first control voltage V1 is applied to the other end of the ninth switch SW9, whereas a second control voltage V2 is applied to the other end of the tenth switch SW10. Similarly, one end of the third regulating capacitor C5 is connected to the second node B, whereas the other end thereof is connected to the one end of the ninth switch SW9 and the tenth switch SW10, which are connected in parallel with each other.

The first control voltage V1 and the second control voltage V2 are so set as to satisfy a relation expressed by the following Equation (10).

$$V1-V2=E*\{(Vin+)+(Vin-)-(Vref+)+(Vref-)\} \tag{10}$$

where E is a second variant.

The first control voltage V1 is a voltage applied to the first regulating capacitor C3 and the third regulating capacitor C5 when the operational amplifier OP is in an auto-zero AZ state. The second control voltage V2 is a voltage applied to the first regulating capacitor C3 and the third regulating capacitor C5 when the operational amplifier OP is in an amplifying AMP state.

An operation of the amplifier circuit 120 according to the second embodiment is basically the same as that shown in the timing chart of FIG. 2 except for the operations of the fifth switch SW5 to the eighth switch SW8 of FIG. 2. Operations added in the second embodiment are as follows. In a sampling period SMP, the ninth switch SW9 is controlled to be turned on and the tenth switch SW10 is controlled to be turned off. In an amplifying period AMP, the ninth switch SW9 is controlled to be turned off and the tenth switch SW10 is controlled to be turned on.

A potential VAamp2 of the first node A is expressed by the following Equation (11) when the operational amplifier OP according to the second embodiment is in an amplifying AMP state.

$$VAamp2=Vaz+\{(Vref+)-(Vin+)\}*C/Cab+E*\{(Vin+)+(Vin-)-(Vref+)+(Vref-)\}*D*C/Cab \tag{11}$$

Similarly, a potential VBamp2 of the second node B is expressed by the following Equation (12) when the operational amplifier OP according to the second embodiment is in an amplifying AMP state.

$$VBamp2=Vaz+\{(Vref-)-(Vin-)\}*C/Cab+E*\{(Vin+)+(Vin-)-(Vref+)+(Vref-)\}*D*C/Cab \tag{12}$$

Combining the above Equation (1) and Equation (2), a voltage Vsum2 which is the sum of the potential VAamp2 of the first node A and the potential VBamp2 of the node B when the operational amplifier OP according to the second embodiment is in an amplifying AMP state is expressed by the following Equation (13).

$$Vsum2=2Vaz+(1-E*D)*\{(Vref+)+(Vref-)-(Vin+)+(Vin-)\}*C/Cab \tag{13}$$

A voltage obtained after the averaging of the summation result which is represented by the voltage Vsum2 shown in Equation (13) is an input common-mode voltage Vcm2 in an amplifying AMP state of the operational amplifier OP according to the second embodiment. Assume that an ideal value of the input common-mode voltage Vcm2 in an auto-zero AZ state is the auto-zero voltage Vaz in the above Equations (11) to (13), then the input common-mode voltage Vcm2 in an amplifying AMP state can be set to the auto-zero voltage Vaz by setting the first variant D and the second variant E such that (E*D)=1 in the above Equation (13).

If the value of the input common-mode voltage Vcm2 is to be set to a value other than the above-described auto-zero voltage Vaz, (E*D) may be set to a value other than 1. If the values of the input signal Vin+ and the input signal Vin− are known beforehand, it is possible to assign the supply voltage to the first control voltage V1 and assign the ground voltage to the second control voltage V2 by adjusting at least one of the first variant D and the second variant E. In such a case, there is no need to generate the first control voltage V1 and the second control voltage V2 by providing a level shifter circuit and the like, so that the circuitry can be simplified.

According to the second embodiment described as above, the variation in the input common-mode voltage can be suppressed in a similar manner to the first embodiment. As a result, the output common-mode voltage can be stabilized without the use of a common-mode feedback loop. The fast operation becomes possible. As compared with the circuit configuration of the first embodiment, there is no need to provide the fifth switch SW5 to the eighth switch SW8, so that the circuitry can be simplified. Also, setting the voltage difference between the first control voltage V1 and the second control voltage V2 to a relatively large value allows the reduction in capacitance values of the regulating capacitors. Hence, the circuit area can be reduced.

Figure 4:
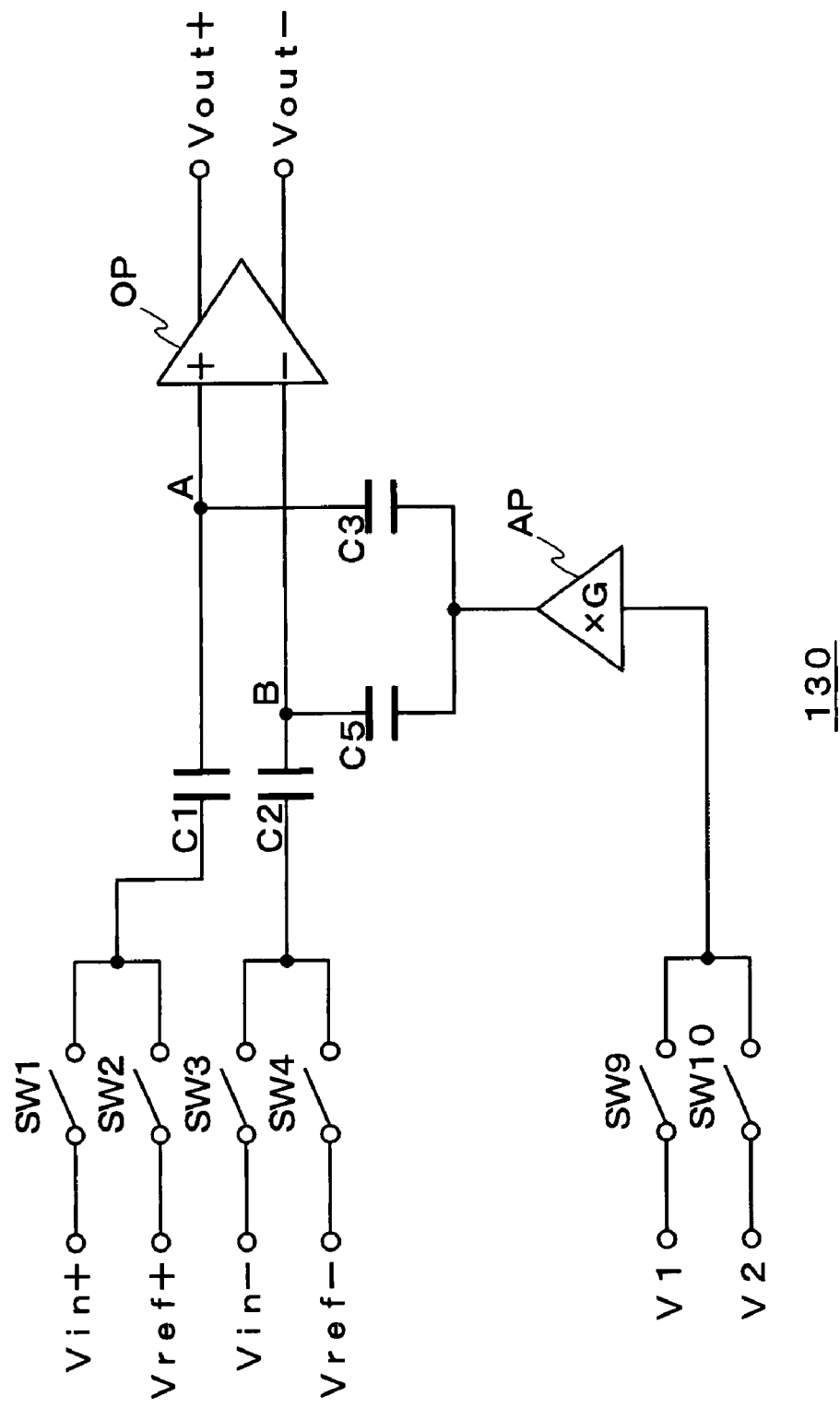
FIG. 4 is a circuit diagram showing a structure of an amplifier circuit according to a third embodiment of the present invention.

FIG. 4 is a circuit diagram showing a structure of an amplifier circuit 130 according to a third embodiment of the present invention. The basic structure of the amplifier circuit 130 according to the third embodiment is the same as that of the amplifier circuit 120 according to the second embodiment. Differences from the second embodiment will be described hereinbelow.

Compared with the amplifier circuit 120 according to the second embodiment, the structure of the amplifier circuit 130 according to the third embodiment is such that an amplifier AP is added. One end of the first regulating capacitor C3 is connected to the first node A, whereas the other end thereof is connected to an output terminal of the amplifier AP. Similarly, one end of the third regulating capacitor C5 is connected to the second node B, whereas the other end thereof is connected to the output terminal of the amplifier AP. An input terminal of the amplifier AP is connected to one end of the ninth switch SW9 and the tenth switch SW10, which are connected in parallel with each other. The first control voltage V1 is applied to the other end of the ninth switch SW9, whereas the second control voltage V2 is applied to the other end of the tenth switch SW10. The gain of the amplifier AP is Ex. This gain E corresponds to the second variant E.

The operation of the amplifier circuit 130 according to the third embodiment is the same as that of the amplifier circuit 120 according to the second embodiment. The potentials of the first node A and the second node B thereof according to the third embodiment are also the same as those thereof according to the second embodiment.

According to the third embodiment explained as above, the same advantageous effects as with the second embodiment can be achieved. Also, if the gain E of the amplifier AP is set higher, the capacitance values of the regulating capacitors can be made smaller and therefore the circuit area can be further reduced.

Figure 5:
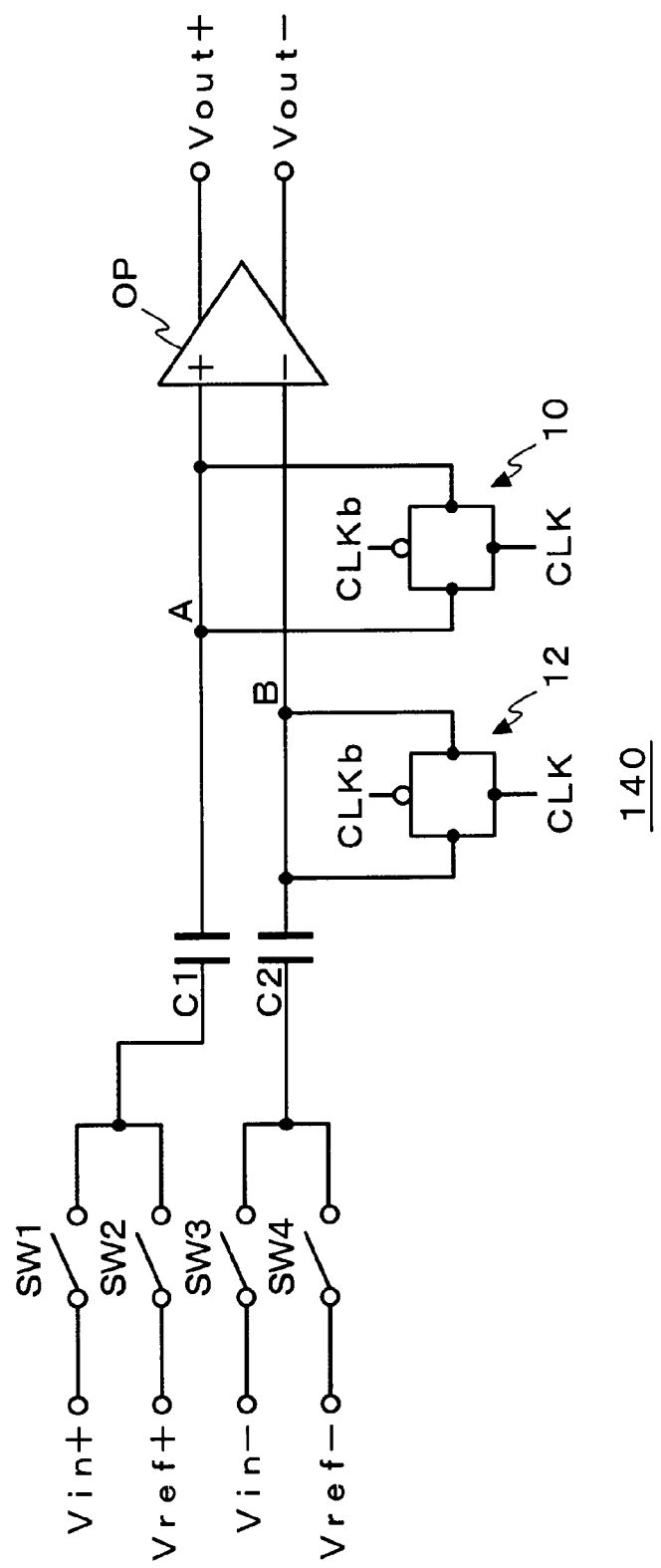
FIG. 5 is a circuit diagram showing a structure of an amplifier circuit according to a fourth embodiment of the present invention.

FIG. 5 is a circuit diagram showing a structure of an amplifier circuit 140 according to a fourth embodiment of the present invention. The basic structure of the amplifier circuit 140 according to the fourth embodiment is the same as that of the amplifier circuit 110 according to the first embodiment. Differences from the first embodiment will be described hereinbelow.

Compared with the amplifier circuit 110 according to the first embodiment, the structure of the amplifier circuit 140 according to the fourth embodiment is such that the second regulating capacitor C4, the fourth regulating capacitor C6, the fifth switch SW5, the sixth switch SW6, the seventh switch SW7 and the eighth switch SW8 are omitted. A first dummy switch 10 is provided in place of the first regulating capacitor C3, whereas a second dummy switch 12 is provided in place of the third regulating capacitor C5.

CMOS (Complementary Metal Oxide Semiconductor) switches are used for the first dummy switch 10 and the second dummy switch 12. The CMOS switch is comprised in combination of an N-channel MOSFET and a P-channel MOSFET. A first clock signal CLK is inputted to a gate terminal of the N-channel MOSFET, whereas a first inverted clock signal CLKb, where the phase of first clock signal CLK is inverted, is inputted to a gate terminal of the P-channel MOSFET. While the CMOS switch turns on, a capacitance is produced between the gate and the channel thereof.

A source terminal and a drain terminal of the first dummy switch 10 are both connected to a signal line connecting the first sampling capacitor C1 to the noninverting input terminal of the operational amplifier OP. Similarly, a source terminal and a drain terminal of the second dummy switch 12 are both connected to a signal line connecting the second sampling capacitor C2 to the inverting input terminal of the operational amplifier OP.

An operation of the amplifier circuit 140 according to the fourth embodiment is described hereinbelow.

FIG. 6 is a timing chart to explain the operation of the amplifier circuit 140 according to the fourth embodiment. The top row in FIG. 6 indicates a state of the amplifier circuit 140 where a sampling SMP period and an amplifying AMP period repeat alternately. In the following description, it is assumed that the high level of the first clock signal CLK and the first inverted clock signal CLKb is set to the supply voltage and the low level thereof is set to the ground voltage.

During a sampling SMP period, the operational amplifier OP is in an auto-zero AZ state. Control is performed so that the first clock signal CLK goes to a low level (Low) and the first inverted clock CLKb goes to a high level (High). Control is performed so that the first switch SW1 and the third switch SW3 are turned on and the second switch SW2 and the fourth switch SW4 are turned off. Since a low-level signal (Low) is inputted to the gate terminal of the N-channel MOSFET and a high-level signal (High) is inputted to the gate terminal of the P-channel MOSFET, the first dummy switch 10 and the second dummy switch 12 are controlled to OFF.

During an amplifying AMP period, the operational amplifier OP is in an amplifying AMP state. Control is performed so that the first clock signal CLK goes to a high level (High) and the first inverted CLKb goes to a low level (Low). Control is performed so that the first switch SW1 and the third switch SW3 are turned off and the second switch SW2 and the fourth switch SW4 are turned on. Since a high-level signal (High) is inputted to the gate terminal of the N-channel MOSFET and a low-level signal (Low) is inputted to the gate terminal of the P-channel MOSFET, the first dummy switch 10 and the second dummy switch 12 are controlled to ON.

In a state where the first dummy switch 10 and the second dummy switch 12 which are each constituted by a CMOS switch are turned on, a capacitance is each induced between the gate and the channel of the CMOS switch. The effect of a clock signal inputted to the gate terminal propagates from the channel to the source terminal or drain terminal. For example, when the clock signal inputted to the gate terminal of the P-channel MOSFET transits from a high level (High) to a low level (Low), the channel is not formed at first but it begins to be formed gradually. At this time, as the voltage at the gate terminal drops, the voltage at the source terminal and the drain terminal drops due to the effect therefrom.

First considered is a case where first dummy switch 10 and the second dummy switch 12 constituted by CMOS switches are turned on. When the potential of the first node A and the second node B is relatively low, the period during which the N-channel MOSFETs that constitute the first dummy switch 10 and the second dummy switch 12 are turned on becomes longer. Since a capacitance is each produced between the gate and the channel of each CMOS switch during a period when the each CMOS switch is turned on, the potential of the first node A and the second node B rises due to the effect of the voltages at the gate terminals.

On the other hand, when the potential of the first node A and the second node B is relatively high, the period during which the P-channel MOSFETs that constitute the first dummy switch 10 and the second dummy switch 12 are turned on becomes longer. Since a capacitance is each produced between the gate and the channel of each CMOS switch during a period when the each CMOS switch is turned on, the potential of the first node A and the second node B rises due to the effect of the voltages at the gate terminals.

Next considered is a case where first dummy switch 10 and the second dummy switch 12 constituted by CMOS switches are turned off. When the potential of the first node A and the second node B is relatively low, the period during which the N-channel MOSFETs that constitute the first dummy switch 10 and the second dummy switch 12 are turned on becomes longer. Since a capacitance is each produced between the gate and the channel of each CMOS switch during a period when the each CMOS switch is turned on, the potential of the first node A and the second node B drops due to the effect of the voltages at the gate terminals.

On the other hand, when the potential of the first node A and the second node B is relatively high, the period during which the P-channel MOSFETs that constitute the first dummy switch 10 and the second dummy switch 12 are turned on becomes longer. Since a capacitance is each produced between the gate and the channel of each CMOS switch during a period when the each CMOS switch is turned on, the potential of the first node A and the second node B drops due also to the effect of the voltages at the gate terminals.

When the potential of the first node A and the second node B in a sampling SMP period and an amplifying AMP period can be predicted, a capacitance value required to offset a deviation of the common-mode voltage of the input signal Vin from that of the reference voltage Vref can be calculated. Then capacitances having the thus calculated capacitance values may be connected to the first node A and the second node B. In order that the above-described gate-channel capacitances operate as these capacitances, at least one of the type, the size of the first dummy switch 10 and the second dummy switch 12 and the input timing of the first clock signal and the first inverted clock signal CLKb to the gate terminals are adjusted.

If the size of the first dummy switch 10 and the second dummy switch 12 is to be adjusted, it is desirable that adjustment be made by varying the channel length L instead of the channel width W. If the channel width W is enlarged, a fringing capacitance will rise and thereby a variation will be more likely to occur. In contrast thereto, if the channel length L is enlarged to adjust the gate-channel capacitance, a capacitance where the variation is less likely to occur can be formed.

According to the fourth embodiment described as above, the provision of dummy switches allows the suppression of variation in the input common-mode voltage. Hence, the output common-mode voltage can be stabilized without the use of a common-mode feedback loop. Also, faster operation can be achieved.

Figure 7:
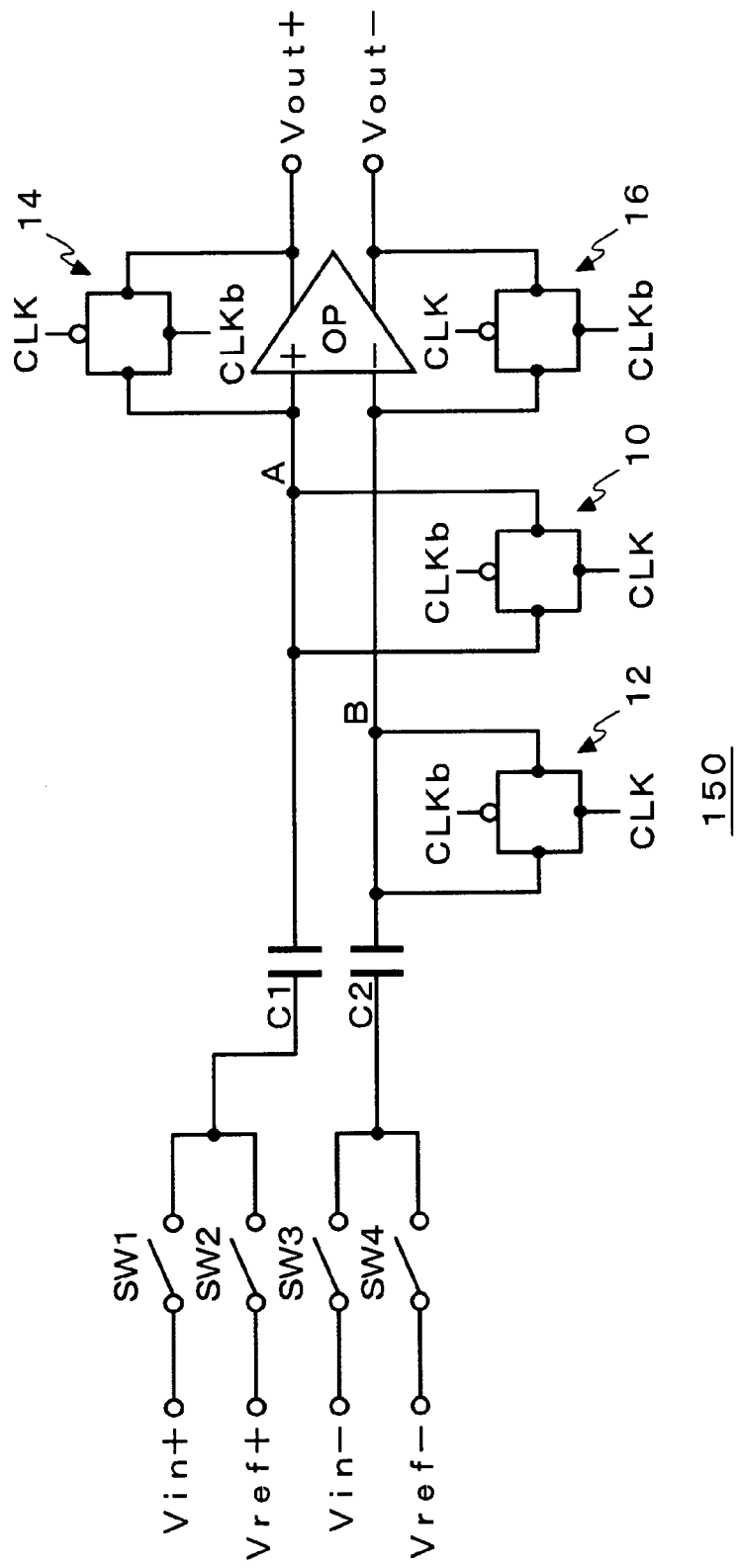
FIG. 7 is a circuit diagram showing a structure of an amplifier circuit according to a fifth embodiment of the present invention.

FIG. 7 is a circuit diagram showing a structure of an amplifier circuit 150 according to a fifth embodiment of the present invention. The basic structure of the amplifier circuit 150 according to the fifth embodiment is the same as that of the amplifier circuit 140 according to the fourth embodiment. Differences from the fourth embodiment will be described hereinbelow.

The structure of the amplifier circuit 150 according to the fifth embodiment is such that a first short-circuiting switch 14 and a second short-circuiting switch 16 are added to the amplifier circuit 140 according to the fourth embodiment. Turning on the first short-circuiting switch 14 short-circuits the noninverting input terminal and the noninverting output terminal of the operational amplifier OP. When the second short-circuiting switch 16 is turned on, the inverting input terminal and the inverting output terminal of the operational amplifier OP are short-circuited. That is, when the first short-circuiting switch 14 and the second short-circuiting switch 16 are turned on, the operational amplifier OP is in a unity gain buffer state and therefore an auto-zero AZ state can be generated.

CMOS switches are used for the first short-circuiting switch 14 and the second short-circuiting switch 16. A first inverted clock signal CLKb is inputted to the gate terminals of P-channel MOSFETs that constitute CMOS switches, whereas a first clock signal CLK is inputted to the gate terminals of N-channel MOSFETs. The clock signal inputted to the gate terminals of the N-channel MOSFETs and the P-channel MOSFETs of the first short-circuiting switch 14 and the second short-circuiting switch 16 is reverse in phase to the clock signal inputted to the gate terminals of the N-channel MOSFETs and the P-channel MOSFETs of the first dummy switch 10 and the second dummy switch 12.

With the amplifier circuit 140 according to the fourth embodiment, the first short-circuiting switch 14 and the second short-circuiting switch 16 are in an ON state during a sampling SMP period, and gate-channel capacitances are generated in the first short-circuiting switch 14 and the second short-circuiting switch 16. When the first short-circuiting switch 14 and the second short-circuiting 16 are turned off to transit from the sampling SMP period to an amplifying AMP period, channel charge injection noise or clock feedthrough noise is generated.

During an amplifying AMP period, the first dummy switch 10 and the second dummy switch 12 are in an ON state and gate-channel capacitances are generated. Due to these gate-channel capacitances, the electric charges that have flowed out when the first short-circuiting switch 14 and the second short-circuiting switch 16 were turned off are offset. Assume that one half each of the electric charge is released to the input terminal and the output terminal of the operational amplifier OP from the first short-circuiting switch 14, then the thus released one half of the electric charge will flow into the first node A. The same applies to the second short-circuiting switch 10 and the second node B. If the size of the first dummy switch 10 is designed to be set to the half of the first short-circuiting switch 14, the electric charge that has flowed into the first node A can be offset exactly. The same applies to the second dummy switch 12, the second short-circuiting switch 16 and the second node B.

In this manner, the first dummy switch 10 and the second dummy switch 12 according to the fifth embodiment have a property of offsetting noise components occurring in the first short-circuiting switch 14 and the second short-circuiting switch 16. An operation to suppress the variation in the input common-mode voltage as described in the fourth embodiment is combined into these first short-circuiting switch 14 and second short-circuiting switch 16. Thus the size of the first dummy switch 10 and the size of the second dummy switch 16 are not set to half the size of the first short-circuiting switch 14 and half the size of the second short-circuiting switch 16, respectively, but are set to values according to the level of required gate-channel capacitances.

According to the fifth embodiment described as above, the same advantageous effects as with the fourth embodiment are achieved. Further, since the existing dummy switches for offsetting the noise occurring in the short-circuiting switches of an operational amplifier can be utilized, the existing configuration can be utilized effectively.

Figure 8:
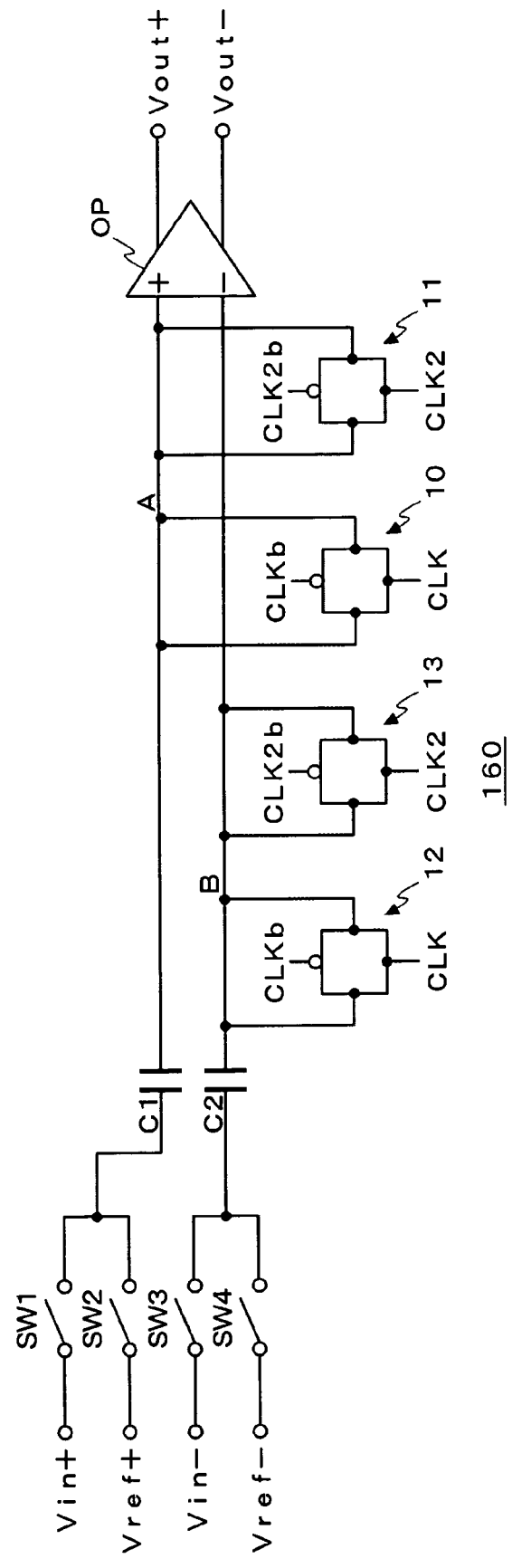
FIG. 8 is a circuit diagram showing a structure of an amplifier circuit according to a sixth embodiment of the present invention.

FIG. 8 is a circuit diagram showing a structure of an amplifier circuit 160 according to a sixth embodiment of the present invention. The structure of the amplifier circuit 160 according to the sixth embodiment is such that a third dummy switch 11 and a fourth dummy switch 13 are added to the amplifier circuit 140 according to the fourth embodiment. In the sixth embodiment, it is assumed that there are a plurality of kinds of input signals Vin and reference voltages Vref inputted to the first sampling capacitor C1 and the second sampling capacitor C2. The CMOS switches are also used for the third dummy switch 11 and the fourth dummy switch 13, respectively. A second clock signal CLK2 is inputted to gate terminals of N-channel MOSFETs, whereas a second inverted clock signal CLK2b obtained by inverting the phase of said second clock signal CLK2 is inputted to gate terminals of P-channel MOSFETs.

The third dummy switch 11 and the fourth dummy switch 13 are connected in the same way as the first dummy switch 10 and the second dummy switch 12 are connected, respectively. That is, a source terminal and a drain terminal of the third dummy switch 11 are both connected to a signal line connecting the first sampling capacitor C1 and the noninverting input terminal of the operational amplifier OP. Similarly, a source terminal and a drain terminal of the fourth dummy switch 13 are both connected to a signal line connecting the second sampling capacitor C2 and the inverting input terminal of the operational amplifier OP.

Each of the third dummy switch 11 and fourth dummy switch 13 and each of the first dummy switch 10 and the second dummy switch 12 are set in a manner such that at least one of the size and the amplitude level of a clock signal differs therebetween. Thus, the capacitance values of gate-channel capacitances occurring in the third dummy switch 11 and the fourth dummy switch 13 and the capacitance values of gate-channel capacitances occurring in the first dummy switch 10 and the second dummy switch 12 can be made to differ from each other. Dummy switches are selected according to the kind of the input signal Vin or the reference voltage Vref inputted to the first sampling capacitor C1 and the second sampling capacitor C2.

It is assumed in FIG. 8 that there are two kinds of inputs, so that two kinds of dummy switches are provided. However, if three or more kinds of inputs are assumed, three or more kinds of dummy switches may be provided.

According to the sixth embodiment described as above, the same advantageous effects as with the fourth embodiment are achieved. Further, a configuration having a plurality of kinds of inputs to the sampling capacitors can also be effectively dealt with.

Figure 9:
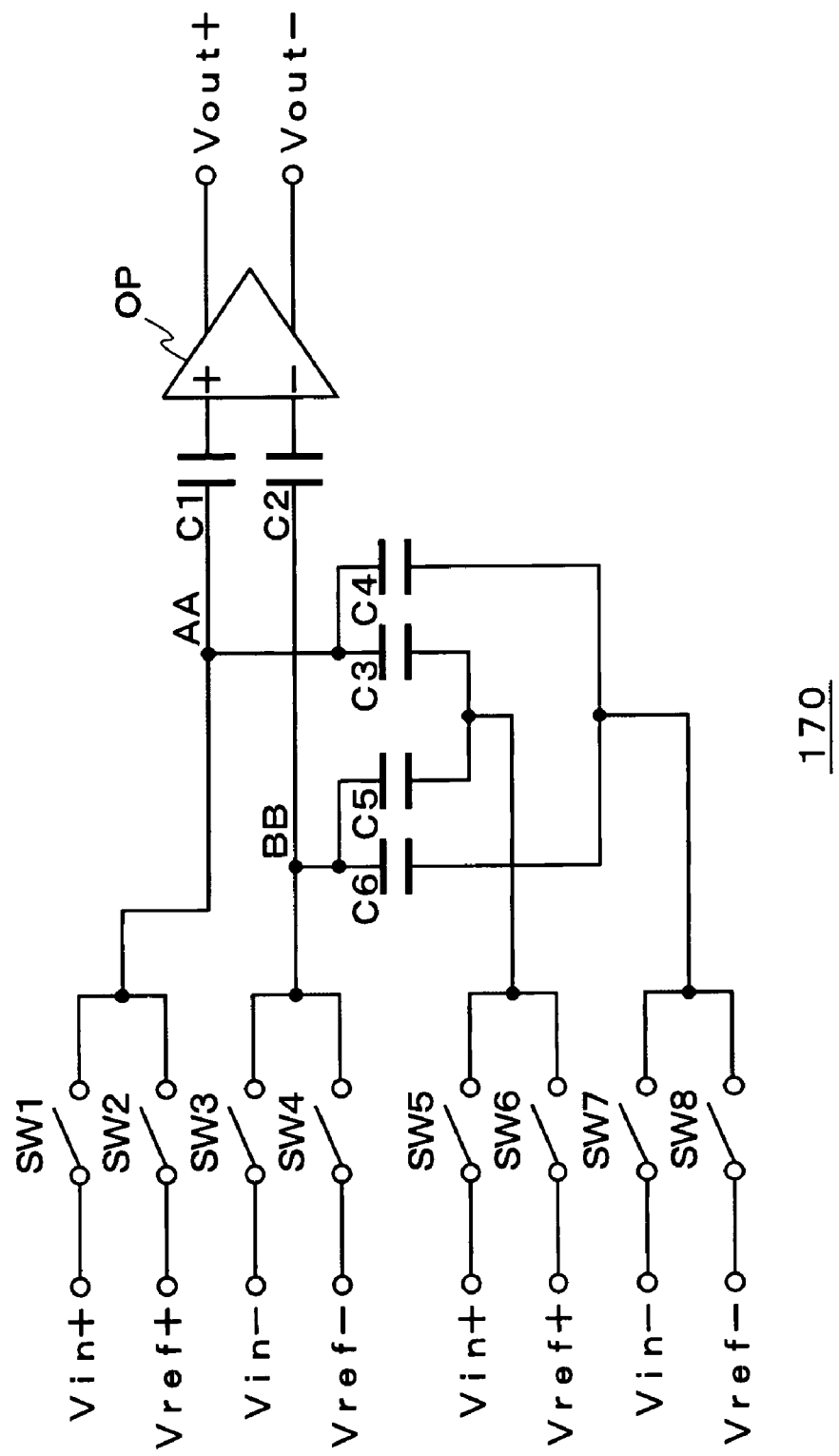
FIG. 9 is a circuit diagram showing a structure of an amplifier circuit according to a seventh embodiment of the present invention.

FIG. 9 is a circuit diagram showing a structure of an amplifier circuit according to a seventh embodiment of the present invention. The basic structure of the amplifier circuit 170 according to the seventh embodiment is the same as that of the amplifier circuit 110 according to the first embodiment. Differences from the first embodiment will be described hereinbelow.

In the amplifier circuit 170 according to the seventh embodiment, the first regulating capacitor C3, the second regulating capacitor C4, the third regulating capacitor C5 and the fourth regulating capacitor C6 are connected to the input-side terminals of the first sampling capacitor C1 and the second sampling capacitor C2, instead of the terminals in an operational amplifier OP side (i.e., output-side terminals of the first sampling capacitor C1 and the second sampling capacitor C2).

FIG. 10 is a timing chart to explain an operation of the amplifier circuit 170 according to the seventh embodiment. The top row in FIG. 10 indicates a state of the amplifier circuit 170 where a sampling SMP period and an amplifying AMP period repeat alternately. Note that a hold period is inserted between a sampling SMP period and an amplifying AMP period wherein the hold period is a period during which a sampled value is simply held, without being amplified, after a momentary value at an end timing of a sampling SMP period has been sampled.

During a sampling SMP period, the operational amplifier OP is in an auto-zero AZ state. Control is performed so that the first switch SW1 and the third switch SW3 are turned on. The second switch SW2 and the fourth switch SW4 are so controlled as to maintain the OFF state from an amplifying AMP period. Also, control is performed so that the fifth switch SW5 and the seventh switch SW7 are turned off and the sixth switch SW6 and the eighth switch SW8 are turned on.

The first sampling capacitor C1 samples a positive input signal Vin+ at the end timing of a sampling SMP period and stores the electric charge equivalent to $C1v\{Vaz-(Vin+)\}$. The second sampling capacitor C2 samples a negative input signal Vin- at the end timing of a sampling SMP period and stores the electric charge equivalent to $C2v\{Vaz-(Vin-)\}$. A positive reference voltage Vref+ is applied to an input-side terminal of the first regulating capacitor C3. A positive input signal Vin+ is applied to a first-sampling-capacitor-C1-side terminal of the first regulating capacitor C3. And the first regulating capacitor C3 stores the electric charge equivalent to $C3v\{(Vin+)-(Vref+)\}$. A negative reference voltage Vref- is applied to an input-side terminal of the second regulating capacitor C4. A negative input signal Vin- is applied to a first-sampling-capacitor-C1-side terminal of the second regulating capacitor C4. And the second regulating capacitor C4 stores the electric charge equivalent to $C4v\{(Vin-)-(Vref-)\}$. A positive reference voltage Vref+ is applied to an input-side terminal of the third regulating capacitor C5. A positive input signal Vin+ is applied to a second-sampling-capacitor-C2-side terminal of the third regulating capacitor C5. And the third regulating capacitor C5 stores the electric charge equivalent to $C5v\{(Vin+)-(Vref+)\}$. A negative reference voltage Vref- is applied to an input-side terminal of the fourth regulating capacitor C6. A negative input signal Vin- is applied to a second-sampling-capacitor-C2-side terminal of the fourth regulating capacitor C6. And the fourth regulating capacitor C6 stores the electric charge equivalent to $C6v\{(Vin-)-(Vref-)\}$.

Before the period transits from a sampling SMP period to an amplifying AMP period, it transits to a hold period. Control is performed so that the first switch SW1 and the third switch SW3 are turned off and the second switch SW2 and the fourth switch SW4 are turned on. Even though a sampling SMP period ends, the fifth switch SW5 and the seventh switch SW7 are so controlled as to maintain the OFF state and the sixth switch SW6 and the eighth switch SW8 are so controlled as to maintain the ON state.

While maintaining the sampled values, the first sampling capacitor C1 and the second sampling capacitor C2 wait for the start of an amplifying period. At this time, the electric charges stored in the first regulating capacitor C3 and the second regulating capacitor C4 flow into a third node AA, so that the voltage at the input-side terminal of the first sampling capacitor C1 is regulated. Similarly, the electric charges stored in the third regulating capacitor C5 and the fourth regulating capacitor C6 flow into a fourth node BB, so that the voltage at the input-side terminal of the second sampling capacitor C2 is regulated.

During an amplifying AMP period, the operational amplifier OP is in an amplifying AMP state. The first switch SW1 and the third switch SW3 are so controlled as to maintain the OFF state. Control is performed so that the second switch SW2 and the fourth switch SW4 are turned off. Also, the fifth switch SW5 and the seventh switch SW7 are controlled to be turned on, and the sixth switch SW6 and the eighth switch SW8 are controlled to be turned off. The third node AA and the fourth node BB are in floating states.

According to the seventh embodiment described as above, the same advantageous effects as with the first embodiment can be achieved even if the regulating capacitors are not connected to the output sides of the sampling capacitors but to the input sides thereof.

The description of the invention given above is based upon illustrative embodiments. These exemplary embodiments are intended to be illustrative only and it will be obvious to those skilled in the art that various modifications to constituting elements and processes could be developed and that such modifications are also within the scope of the present invention.

The amplifier circuits 110 to 170 according to the first to the seventh embodiment are all applicable to an amplifier or an preamplifier of a comparator. They are also applicable to an input stage circuit for a sample-and-hold circuit, an arithmetic circuit, a differentiating circuit, an integrating circuit, a filter circuit, or the like.

In the fourth to the sixth embodiment, a description has been given of an example where CMOS switches are used as the dummy switches. In this regard, however, N-channel MOSFETs alone may be used, instead of CMOS switches, as long as the potential assumed from the first node A and the second node B and the amplitude level of a clock signal CLK are in a range in which the N-channel MOSFET operates normally. Similar to the P-channel MOSFET, P-channel MOSFETs alone may be used, instead of CMOS switches. In such a case, the circuit area can be reduced.

While the preferred embodiments of the present invention and the modifications to the embodiments have been described using specific terms, such description is for illustrative purposes only, and it is to be understood that changes and variations may be further made without departing from the spirit or scope of the appended claims.

What is claimed is:

1. An amplifier circuit, comprising:
   an operational amplifier including a pair of differential input terminals;
   sampling capacitors, connected to the differential input terminals, respectively, which sample input signals;
   a regulating capacitor, connected in parallel with one end of each of said sampling capacitors, which adjusts a common-mode voltage of differential input voltages to said operational amplifier; and
   a first switch which short-circuits an output terminal and an input terminal of said operational amplifier,
   wherein the regulating capacitor includes
   a gate-channel capacitance of a second switch of which a source terminal and a drain terminal are connected to a path connecting said operational amplifier and said sampling capacitor,
   the second switch is turned on during an amplifying period of said amplifier circuit and is turned off during a sampling period of said amplifier circuit, and
   the first switch is turned off during an amplifying period of said amplifier circuit and is turned on during a sampling period of said amplifier circuit.

2. An amplifier circuit comprising:
   an operational amplifier including a pair of differential input terminals;
   sampling capacitors, connected to the differential input terminals, respectively, which sample input signals;
   a regulating capacitor, connected in parallel with one end of each of said sampling capacitors, which adjusts a common-mode voltage of differential input voltages to said operational amplifier; and
   a first switch which short-circuits an output terminal and an input terminal of said operational amplifier, wherein
   the regulating capacitor includes a gate-channel capacitance of a second switch of which a source terminal and a drain terminal are connected to a path connecting said operational amplifier and said sampling capacitor,
   the second switch is turned on during an amplifying period of said amplifier circuit so as to generate the gate-channel capacitance, and is turned off during a sampling period thereof so as to eliminate the gate-channel capacitance, and
   wherein the second switch offsets a charge released to the path by turning off said first switch and using the gate-channel capacitance so as to adjusts potential of the path.

3. An amplifier circuit comprising:
   an operational amplifier including a pair of differential input, terminals;
   sampling capacitors, connected to the differential input terminals, respectively, which sample input signals; and
   a regulating capacitor, connected in parallel with one end of each of said sampling capacitors, which adjusts a common-mode voltage of differential input voltages to said operational amplifier, wherein
   one end of said regulating capacitor is connected to a path connecting said operational amplifier and said sampling capacitor, and a voltage which differs between during an amplifying period and during a sampling period of said amplifying circuit is inputted to the other end of said regulating capacitor,
   a reference voltage is inputted to said sampling capacitor during the amplifying period, and
   wherein the input signal is inputted to the other end of said regulating capacitor during the amplifying period, and the reference voltage is inputted thereto during the sampling period.

* * * * *